(12) United States Patent
Reynolds et al.

(10) Patent No.: US 6,480,985 B1
(45) Date of Patent: Nov. 12, 2002

(54) METHOD AND APPARATUS FOR GRAPHICALLY PRESENTING AN INTEGRATED CIRCUIT DESIGN

(75) Inventors: Michael J. Reynolds, Newbury (GB); Jacob L. Tredinnick, Kintbury (GB); Shahram Najm, Reading (GB); Michael E. J. Gilford, Blewbury (GB); Gordon N. Walker, Hungerford (GB); Mark W. P. Dane, Taston (GB)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 09/140,632

(22) Filed: Aug. 26, 1998

(51) Int. Cl.[7] .............................................. G06F 17/50
(52) U.S. Cl. ........................................... 716/1; 716/18
(58) Field of Search .............................. 716/1, 5, 18, 4, 716/19

(56) References Cited

U.S. PATENT DOCUMENTS 5,537,580 A * 7/1996 Giomi et al. ................. 716/19
5,774,370 A * 6/1998 Giomi ............................ 716/4
6,182,268 B1 * 1/2001 McElvain ....................... 716/1

OTHER PUBLICATIONS

Hoskote et al "Automated Verification of Temporal Properties Specified as State Machine in VHDL," IEEE, 1995, pp. 100–105.*

Kam et al "Comparing Layouts With HDL Models: A Formal Verification Technique," IEEE, Apr. 4, 1995.*

Cheng et al "Compiling Verilog Into Timed Finite State Machines," IEEE, 1995, pp. 32–39.*

Wu et al "A Synthesis Method for Mixed Synchronous/Asynchronous Behavior," IEEE, 1994, pp. 277–281.*

"IEEE Standard VHDL Language Reference Manual," ANSI Standard 1076–1993, Published Jun. 6, 1994.

"IEEE Standard Hardware Description Language Based on the Verilog Hardware Description Language," IEEE Standard 1364–1995, Published Oct. 14, 1996.

* cited by examiner

Primary Examiner—Vuthe Siek
(74) Attorney, Agent, or Firm—Blakely Sokoloff Taylor & Zafman LLP

(57) ABSTRACT

Briefly, the present invention analyzes high-level IC description language code, such as VHDL and Verilog, of an integrated circuit (IC) design and generates graphical representations of the IC design based on the code analyzed. The graphical representations can include one or more of the following: 1) a block diagram of functional blocks; 2) a state diagram of a state machine; and 3) a flow chart of an operation al flow of the IC. Graphical representations provide more understandable representations of circuits described by the high-level IC description language code than the code itself.

33 Claims, 13 Drawing Sheets

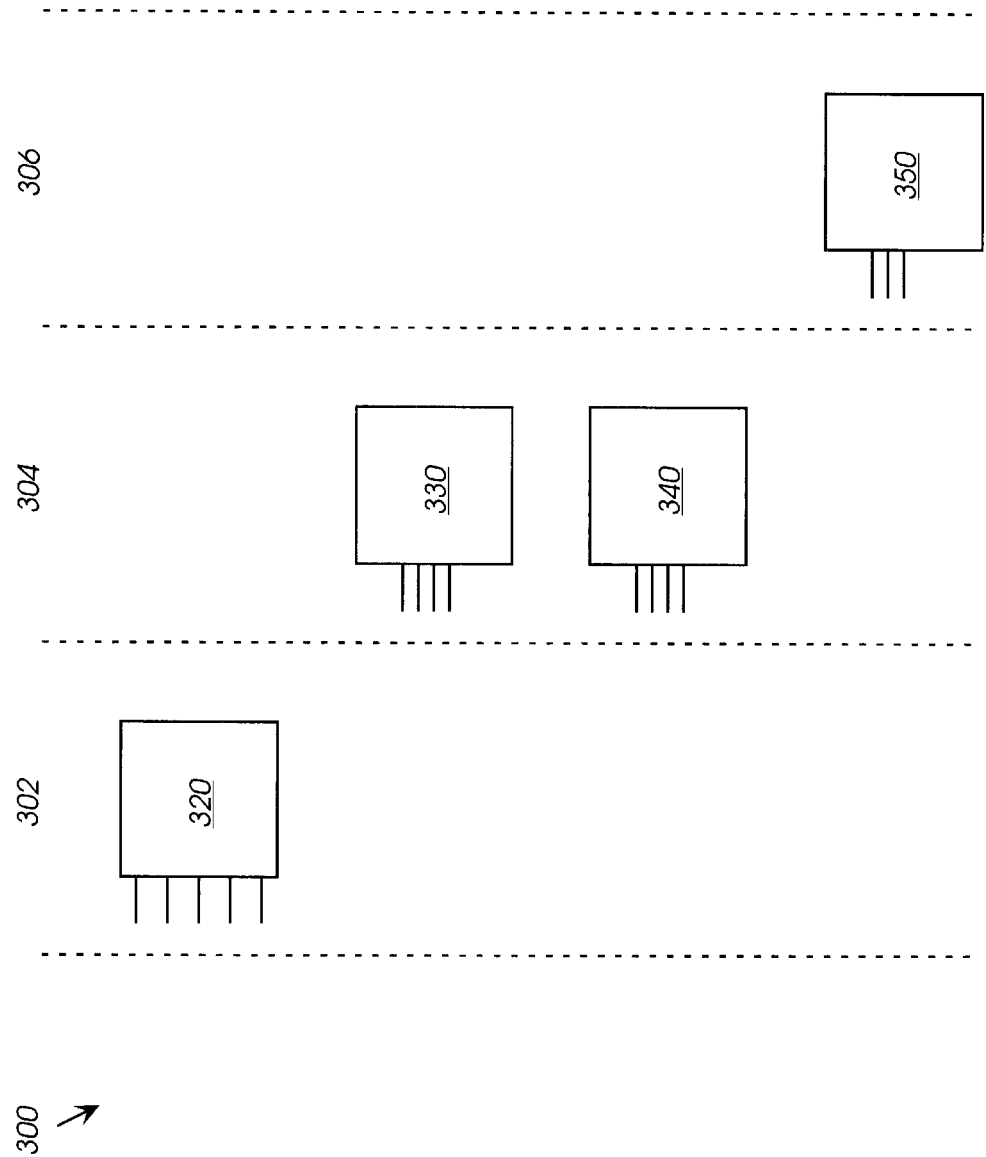

METHOD AND APPARATUS FOR GRAPHICALLY PRESENTING AN INTEGRATED CIRCUIT DESIGN

FIELD OF THE INVENTION

The present invention relates to circuit design tools. More particularly, the present invention relates to graphical representations of circuit designs described in terms of high-level description language code.

BACKGROUND OF THE INVENTION

High-level integrated circuit (IC) description languages such as VHDL and Verilog® are commonly used to design circuits. One embodiment of VHDL is described in greater detail in "IEEE Standard VHDL Language Reference Manual," ANSI Std. 1076-1993, Published Jun. 6, 1994. One embodiment of Verilog® is described in greater detail in IEEE Standard 1364-1995. These high-level IC description languages allow a circuit designer to design and simulate circuits by using high-level code to describe the structure and/or behavior of the circuit being designed.

The high-level IC description language code is used to produce a netlist that describes an interconnection of circuit components that provide the desired functionality. The netlist can then be used to develop the layout and ultimately fabricate an integrated circuit IC having the functionality of the designed circuit. The netlist can also be used for emulation purposes.

The high-level IC description language code can be used to describe a standalone IC designs or a functional components of a larger IC design. Rather than redesigning circuits for use with new applications, existing circuit designs described in terms of high-level IC description language code can be modified. Modification of existing code can be advantageous, for example, when the existing circuit is used in a new environment or as a part of a larger IC design where inputs and/or outputs are slightly different than in the originally designed application. However, modification of code corresponding to an existing circuit design without the original circuit designer can be difficult because the code may not be well documented or may be extensive and confusing. Therefore, modification of existing circuit design code can be time consuming and difficult.

Circuit designers often communicate the structural and behavioral characteristics of circuit designs in terms of block diagrams, state diagrams and flow charts. These representations are more intuitive and are better suited to communicate the functionality of a circuit than high-level IC description language code. For at least this reason, high-level IC description language code is not effective for communicating circuit designs.

What is needed is a tool that helps decipher existing high-level IC description language code.

SUMMARY OF THE INVENTION

A method and apparatus for graphical representation of high-level IC description language code is described. The IC description language code describing an IC design is analyzed. Representation information corresponding to one or more of a block diagram of functional blocks of the IC design, a state diagram of a state machine, and a flow chart of an operational flow of the IC design is extracted from the high-level IC description language code. A graphical representation of the IC design based on the extracted representation information is generated.

BRIEF DESCRIPTION OF THE DRAWINGS

The present invention is illustrated by way of example, and not by way of limitation, in the figures of the accompanying drawings in which like reference numerals refer to similar elements.

FIGS. 3a–3c are one embodiment of a block diagram of a functional block of an IC design generated from its high-level IC description language code.

DETAILED DESCRIPTION

A method and apparatus for graphical representation of high-level IC description language code is described. In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

Briefly, the present invention analyzes high-level IC description language code, such as VHDL and Verilog®, of an integrated circuit (IC) design and generates graphical representations of the IC design based on the code analyzed. The graphical representations can include one or more of the following: 1) a block diagram of functional blocks; 2) a state diagram of a state machine; and 3) a flow chart of an operation al flow of the IC. Graphical representations provide more understandable representations of circuits described by the high-level IC description language code than the code itself. Because high-level IC description language code can be difficult to decipher by one other than the creator of the code, graphical representations, whether structural or behavioral, provide for easier modification of the code than would otherwise be possible.

Figure 1:
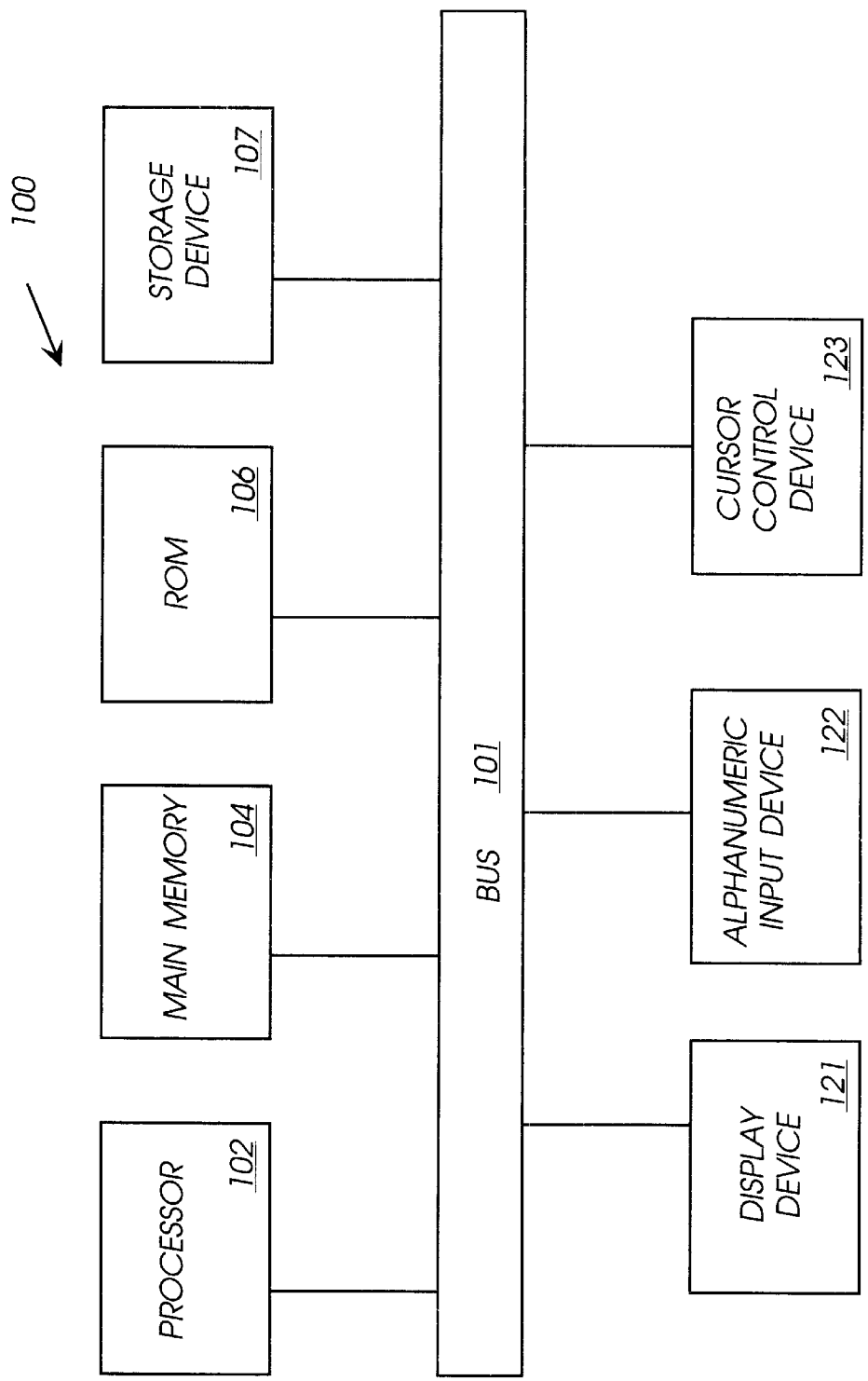
FIG. 1 is one embodiment of a computer system suitable for use to practice the present invention.

FIG. 1 is one embodiment of a computer system suitable for use to practice the present invention. Computer system 100 includes bus 101 or other communication means for communicating information, and processor 102 coupled with bus 101 for processing information. Computer system 100 further includes random access memory (RAM) or other dynamic storage device 104 (referred to as main memory), coupled to bus 101 for storing information and instructions to be executed by processor 102. Main memory 104 also can be used for storing temporary variables or other intermediate information during execution of instructions by processor 102. Computer system 100 also includes read only memory (ROM) and/or other static storage device 106 coupled to bus 101 for storing static information and instructions for processor 102. Data storage device 107 is coupled to bus 101 for storing information and instructions.

Data storage device 107 such as a magnetic disk or optical disc and corresponding drive can be coupled to computer system 100. Computer system 100 can also be coupled via bus 101 to display device 121, such as a cathode ray tube (CRT) or liquid crystal display (LCD), for displaying information to a computer user. Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

One embodiment of the present invention is related to the use of computer system 100 to provide graphical representation of an IC design based on its high-level IC description language code. According to one embodiment, graphical representation is provided by computer system 100 in response to processor 102 executing sequences of instructions contained in memory 104. Instructions are provided to main memory 104 from a storage device, such as magnetic disk, CD-ROM, DVD, via a remote connection (e.g., over a network), etc. In alternative embodiments, hard-wired circuitry can be used in place of or in combination with software instructions to implement the present invention. Thus, the present invention is not limited to any specific combination of hardware circuitry and software instructions.

Overview Of Block Diagram Extraction

Figure 2:
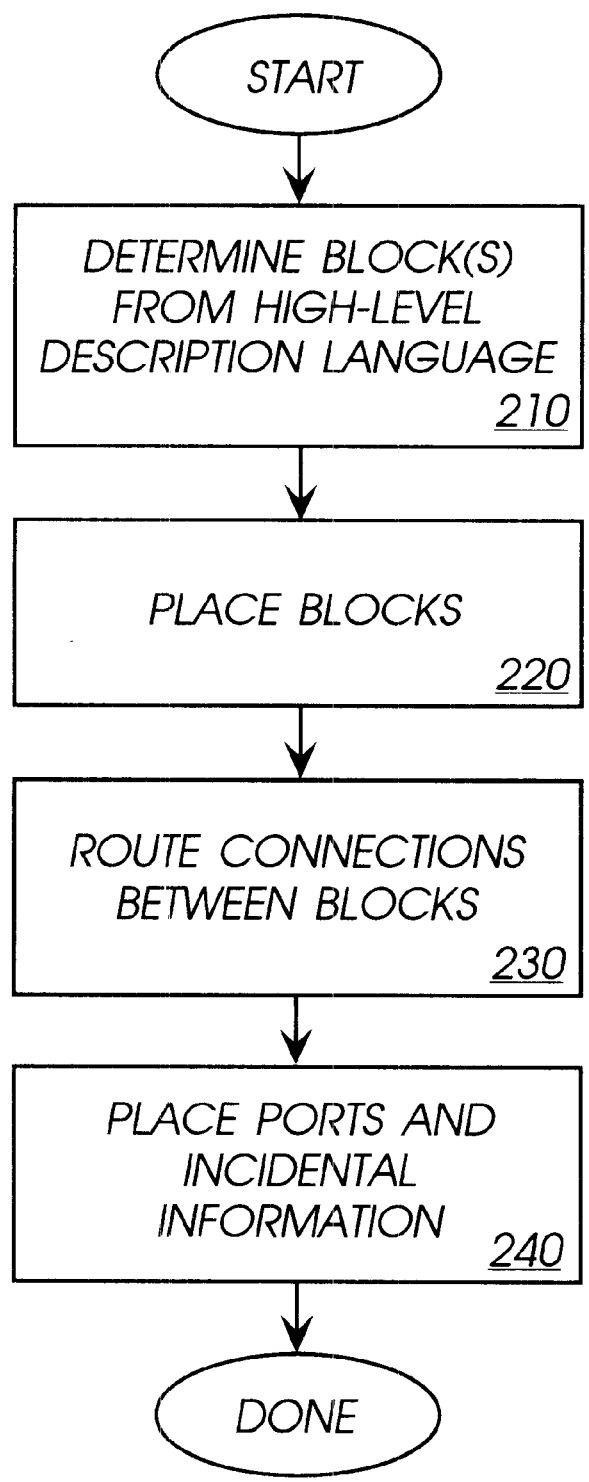
FIG. 2 is one embodiment of a flow diagram for providing a graphical representation of a block diagram of structural blocks of an IC design based on its high-level IC description language code.

FIG. 2 is one embodiment of a flow diagram for providing a graphical representation of a block diagram of structural blocks of an IC design based on its high-level IC description language code. The block diagram provides a structural model of the circuit described by the high-level IC description language code. In the following description, analysis of code is described with respect to VHDL code; however any high-level IC description language can be used. In one embodiment, Verilog® code is converted to VHDL code prior to analysis and extraction of a block diagram.

In VHDL, "entity" statements describe components that can be represented as blocks in a block diagram. Inputs and outputs related to entities are described as "ports". In one embodiment, the present invention identifies "architecture" statements that contain instances of "entity" statements or a "structural architecture." For example entity cpu_interface is
        port( . . . );
    end entity cu_interface;
    architecture struct of cpu_interface is
    . . .
    components declarations corresponding to instanced entities
        component register
            port( . . . );
    . . .
    component instantiations corresponding to instances and wires
        I0: register
            port map (do=>clk, . . . );
        I1: register
            port map (d0=>sig, . . . );
    end struct;

Architectures can be hierarchical in that an individual architecture statement can include one or more subsystems described as one or more architectures. High-level IC description languages other than VHDL are analyzed in a similar manner for equivalent statements that describe structural relationships.

The VHDL code is analyzed and structural groupings that can be represented as blocks in a block diagram are determined, 210. In one embodiment, blocks can have hierarchical relationships. For example, a block in a high-level block diagram can further include one or more sub-blocks. The sub-blocks and the inter-relationship between the sub-blocks can be shown, for example, when a user clicks a high-level block. Of course, other embodiments for describing a hierarchical relationship can also be used.

Because graphical representation of a block diagram is a logical description rather than a physical description or physical layout of components, space optimization is not important. This allows blocks to be placed within the graphical representation in a manner that allows optimal space utilization. In one embodiment, a structural relationship having 5–10 blocks is assumed; however, any number of blocks can be used. The present invention is not limited to use with code that can be represented by a small number of blocks.

In one embodiment, placement of blocks is a logically distinct operation from routing of connections between blocks. This allows placement of blocks without routing of connections between blocks. In one embodiment, the general flow of connections between blocks is from left to right with inputs on the left side of blocks and outputs on the right side of the blocks. Of course, other flows, for example, right to left, top to bottom, etc. can also be used. In order to provide left to right flow in the block diagram, placement and routing as described below can be used.

Placement of blocks is performed based on the block information extracted in the high-level IC description language, 220. In one embodiment, each block is assigned a "mass" that is based on inputs to the block that are outputs from other blocks. The outputs of each block are not used in determining the mass of the block.

The blocks are placed in columns based on the mass assigned to each block. In one embodiment, blocks with the least mass are placed in the left-most column and columns are progressively filled from left to right with each column having blocks with a higher mass than the column to the immediate left until each block is placed in a column. The result is one or more columns each of which contains blocks having equal mass.

In one embodiment, placement of blocks is accomplished according to the following pseudocode:

```
set all unplaced block masses to 0; //blocks have 0 mass
    and are unplaced
while(unplaced blocks exist){
    for (all unplaced blocks){
        increment block mass by 1 for each input from
            another unplaced
        block; //determine mass for a block
        }
    identify block(s) of lowest mass as a column;
    remove column from unplaced block set;
    }
END
```

In other words, blocks are assigned a mass based on input from other blocks and the blocks with the lowest mass are placed in a column. Masses are recalculated as columns are removed, until there are no blocks not placed in a column.

Channels are used to route connections between blocks, 230. As used herein, a channel refers to the graphical spacing sufficient to show a connection (e.g., wire). In one embodiment, vertical channels between blocks are allocated such that each wire connecting two particular blocks has a vertical channel and at least two horizontal channels between the blocks and the vertical channel. In one embodiment, blocks are placed horizontally such that no more than one block occupies a horizontal channel. The horizontal placement allows channels above and below each block as well as output lines to each block as necessary.

In one embodiment the number of connections between blocks is used to determine the placement of the blocks relative to each other. For example, one vertical channel per output from the first column, plus one vertical channel per input of the second column plus enough extra space to make connections visually distinct is provided.

By providing both horizontal and vertical channels for wires, routing of wires can be accomplished without segments of wires overlapping. Wires may intersect at single points, but no wire segments are co-incident at multiple consecutive points. Routing is complicated by the presence of rippers, which are points at which the second wire branches off of the first wire. In order to handle rippers properly, additional vertical channels are allocated for each ripper.

In one embodiment, routing of wires is accomplished in two phases. One phase routes wires that flow forward through the block diagram (e.g., left to right). The second phase routes wires that provide feedback (e.g., right to left). It is important to note that the order of the phases is not important.

In one embodiment, when routing wires in a forward direction, routing starts at the bottom of the diagram. If a wire end is farther down the block diagram than the start of the wire, two route points are set in the first available vertical channel to the right of the start of the wire. A connection is then routed from the output of the first block to the first route point to the second route point to the input of the second block.

When routing feedback wires, routing starts at the top of the block diagram. If a wire end is farther up than the start of the wire and the wire has not been routed, two route points are set occupying the next available vertical channel to the right of the start of the wire. A connection is then routed from the output of the first block to the first route point to the second route point to the input of the second block.

After blocks have been placed and connections have been routed, ports and incidental information are placed, 240. Ports indicate input to and output from the circuit design. Incidental information includes declarations included in the code, signal names, etc.

Figure 3B:
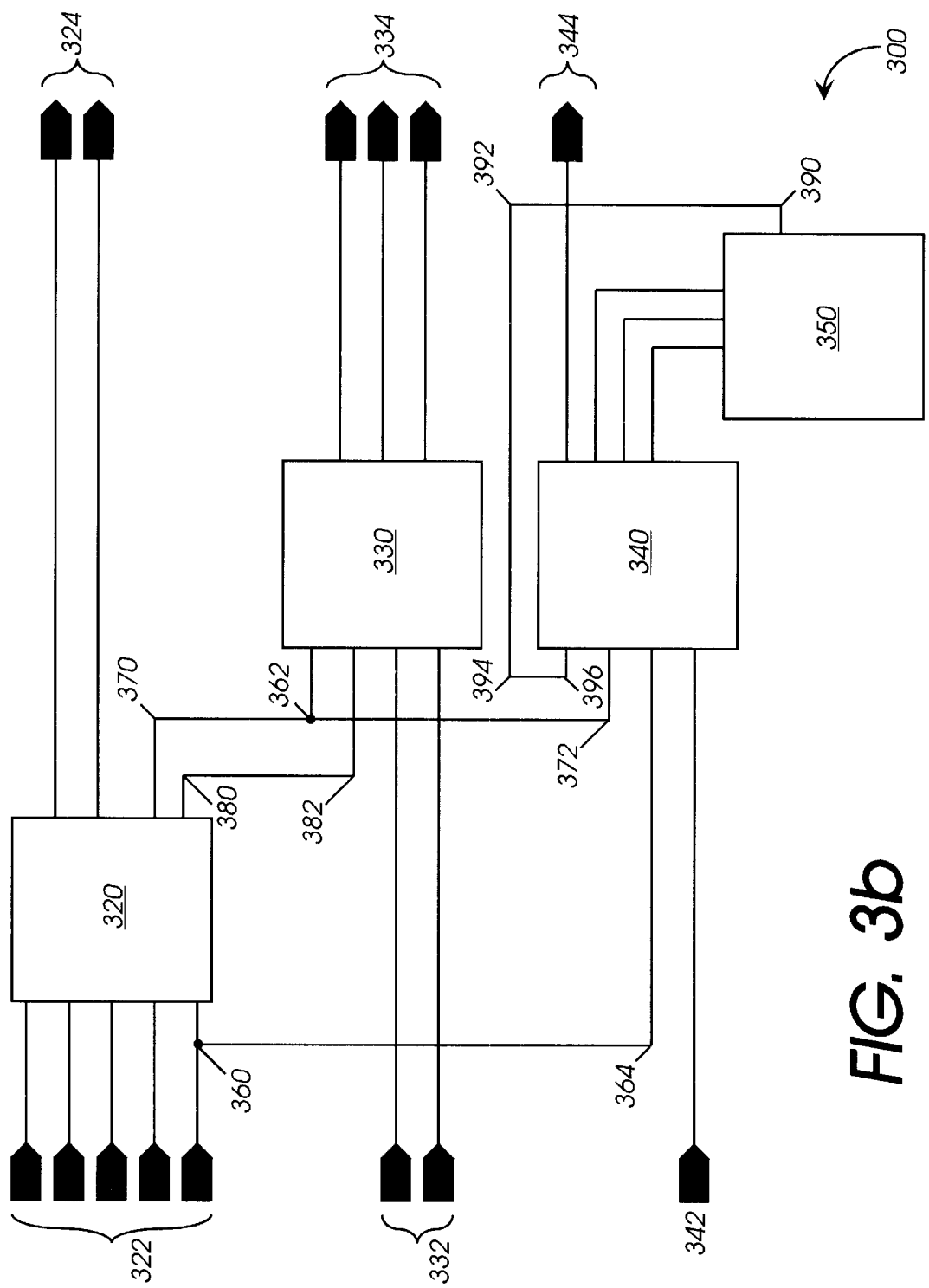
Figure 3C:
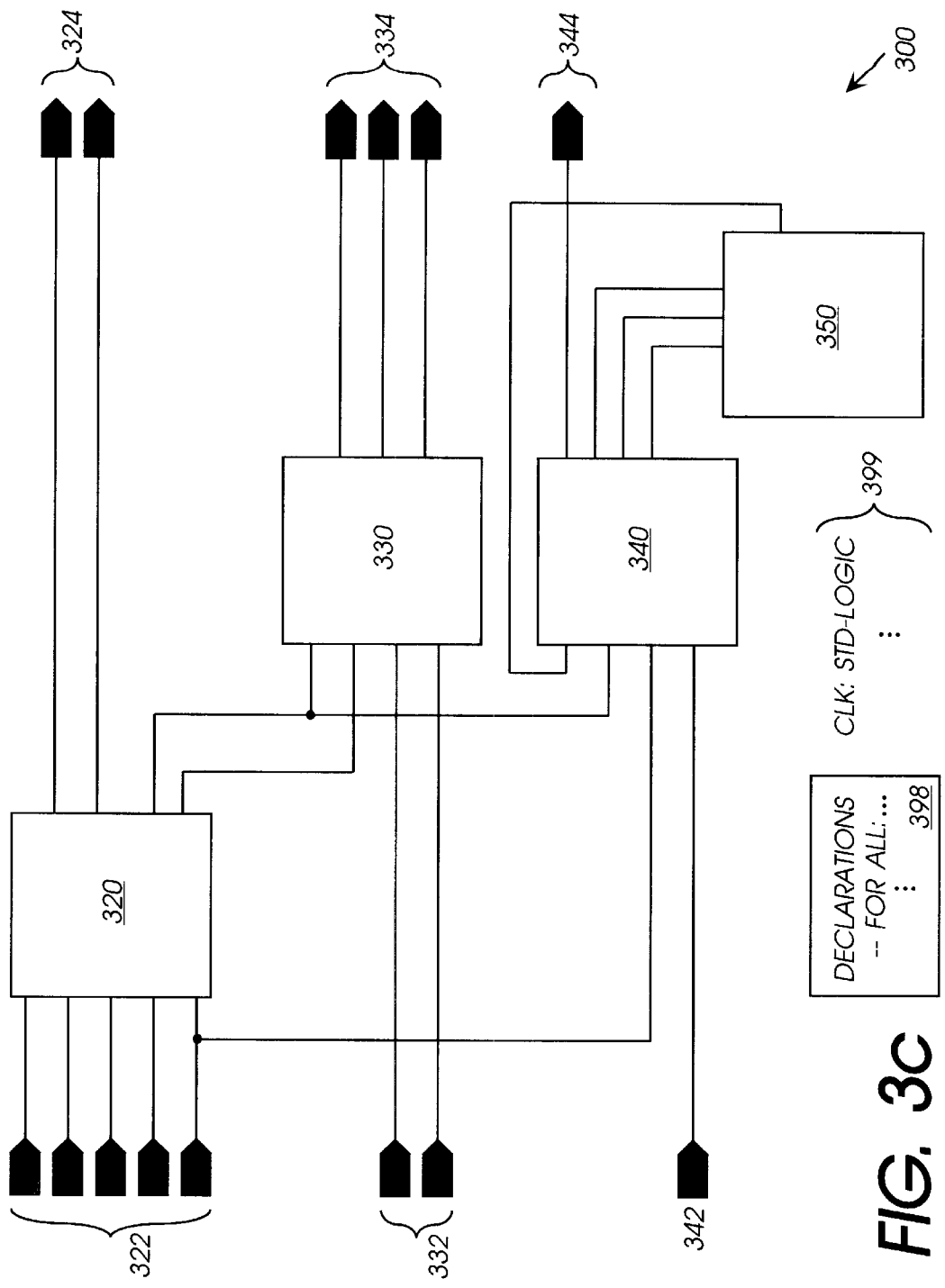

FIGS. 3a–3c are one embodiment of a block diagram of a functional block of an IC design generated from its high-level IC description language code. More specifically, FIG. 3a is one embodiment of blocks placed in block diagram 300 according to the present invention. The example of FIG. 3a places four blocks in three columns; however, any number of blocks in any number of columns can be supported.

In the example of FIG. 3a, block 320 has five inputs with no inputs from other blocks, blocks 330 and 340 have four inputs with two inputs from other blocks and block 350 has three inputs all of which come from other blocks. For simplicity of explination, the source of an input to a block is not shown in FIG. 3a.

In one embodiment, because block 320 has the smallest number of inputs from other blocks of the blocks being placed, block 320 is placed in the first column (labeled 302).

In one embodiment, the blocks are placed starting at the top of the column and proceeding downward such that each subsequently placed block is below the previously placed block(s); however, other types of placement, such as bottom to top placement can also be used.

Blocks 330 and 340, having four inputs two from other blocks, are placed in the second column (labeled 304) and below block 320. Placing blocks below other blocks in previous columns provides horizontal channels for routing of connections between blocks, if necessary. Blocks 330 and 340 are placed in the same column because blocks 330 and 340 have the same number of inputs (the same mass). Block 340 is shown vertically below block 330; however, block 330 can be placed below block 340.

Block 350 is placed in the third column (labeled 306) below blocks 330 and 340. Block 350 has three inputs from other blocks and therefore has greatest mass of the blocks in block diagram 300. The block with the least mass is placed in the left-most column so that the inputs from input ports (not shown in FIG. 3a) have connections that travel the shortest distance and thereby simplify block diagram 300.

FIG. 3b is one embodiment of the block diagram of FIG. 3a having connections between blocks routed according to the present invention. In one embodiment, routing points are placed in block diagram prior to connections being drawn between blocks. The description of FIG. 3b does not include a description of all routing points for block diagram in order to simplify description of routing according to the present invention.

Input ports 322 provide input signals to block 320, input ports 332 provide input signals to block 330. Input ports 342 provides input signals to block 340. Output ports 324 receive output signals from block 320, output ports 334 receive output signals from block 330 and output port 344 receives output signals from block 340.

Routing points 380 and 382 describe a connection between block 320 and block 330. In one embodiment, block diagram in divided into multiple horizontal channels and multiple vertical channels. To describe a simple connection between an output of block 320 and an input of block 330, routing point 380 is placed in the same horizontal channel as the output of block 320 that is being routed. Routing point 380 defines the vertical channel that is used to route the output of block 320. In one embodiment, the first vertical channel that allows a signal name (not shown in FIG. 3b) to be associated with the horizontal portion of the connection is used.

Routing point 382 defines the horizontal channel between the vertical channel defined by routing points 380 and 382 and the corresponding input to block 330. Similarly, routing points 370 and 372 define a connection between an output of block 320 and an input of block 340.

Routing points 360 and 364 define connections between an input port and blocks 320, 330 and 340. Connection point 360 defines a "ripper." A ripper is a point at which a single connection is split into multiple connections. Similarly routing point 362 defines a ripper.

Routing points 390, 392, 394 and 396 define a feedback loop from the output of block 350 to the input of block 340. In one embodiment, the feedback lines use horizontal channels above the blocks to which feedback is being provided. Alternatively, horizontal channels below the blocks can be used.

FIG. 3c is one embodiment of the block diagram of FIG. 3b with the addition of declaration and signal definition fields. In one embodiment, declaration field 398 contains variable declarations from the high-level IC description language code. For example, declaration field 398 can include "FOR ALL" statements. Similarly, signal definition field 399 contains signal types. For example, a clock signal can be defined as a standard logic element. In one embodiment, fields 398 and 399 are placed in a margin of block diagram 300. For example, the top and left margins can be used for fields 398 and 399. Alternatively, the bottom margin can be used for fields 398 and 399. Of course, additional fields can also be provided.

Overview Of State Diagram Extraction

Figure 4:
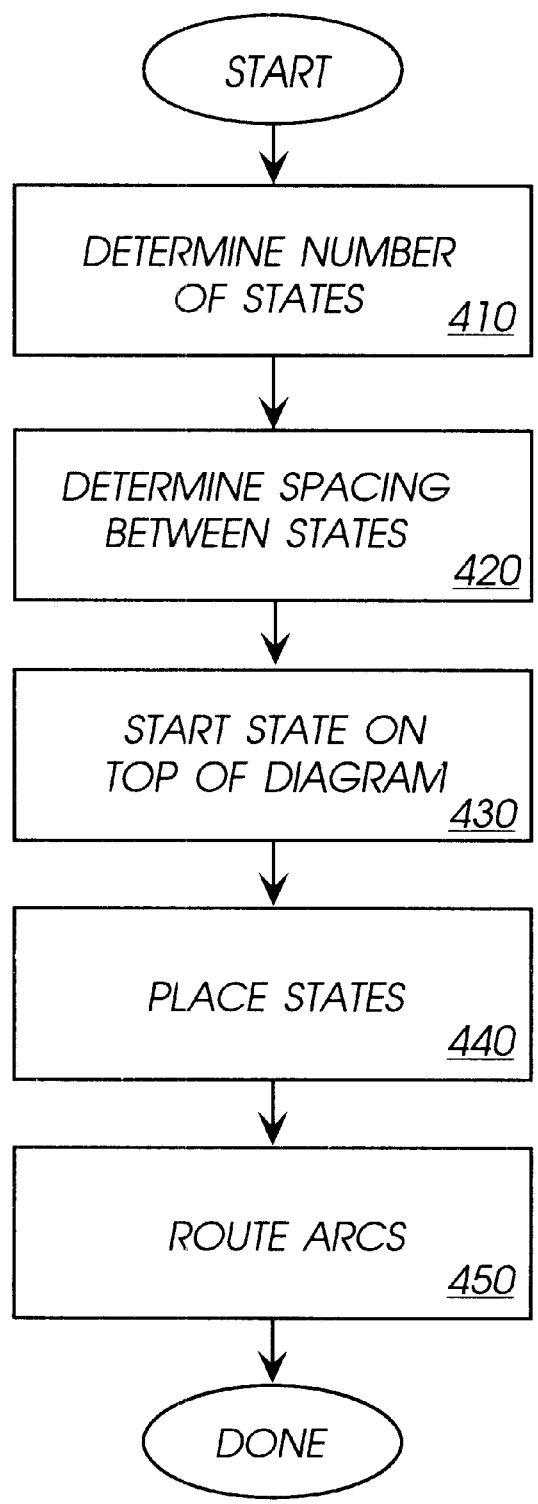
FIG. 4 is one embodiment of a flow diagram for providing a graphical representation of a state diagram of a state machine of an IC based on its high-level IC description language code.

FIG. 4 is one embodiment of a flow diagram for providing a graphical representation of a state diagram of a state machine of an IC based on its high-level IC description language code. In one embodiment, the present invention provides the graphical description of the state machine described in the high-level IC description language in the form of the state diagram. Extraction of the state machine can be accomplished as described in U.S. patent application Ser. No. 09/140,633 filed Aug. 26, 1998, entitled "RECOGNITION OF A STATE MACHINE IN A HIGH-LEVEL DESCRIPTION LANGUAGE," which is assigned to the corporate assignee of the present invention and hereby incorporated by reference.

The high-level IC description language code describing state machine to is analyzed to determine the number of states, 410. In one embodiment, the state diagram is generally circular with evenly spaced states; however, other layouts can also be used. Based on the number of states and the size of the circle to be used the spacing between states is determined, 420.

In one embodiment, the start or initial state is placed at the top of the state diagram, 430. If a reset condition is included in the state machine, a reset loop can be attached to the start state; however, a reset condition is not necessary. The remaining states are placed around the circle in an appropriate order, 440.

In one embodiment, this state that logically follows the start state is placed to the right of the start state such that the states flow in a clockwise manner. Of course, a counter-clockwise or non-circular state layout can also be used. In many state machines states proceed sequentially for all or most of the state machine operation. When only a single state follows the start state, that state is placed adjacent to the start state. Placement of states continues in a similar manner.

After the states have been placed, arcs representing state transitions are routed, 450. In one embodiment, arcs that connect sequential states are routed on the outside of the circle on which the states are placed. Arcs that describe a feedback operation or that skip states are routed on the inside of the circle. Alternatively, sequential transitions can be routed on the inside and circle and other transitions can be routed on the outside of the circle.

Figure 5A:
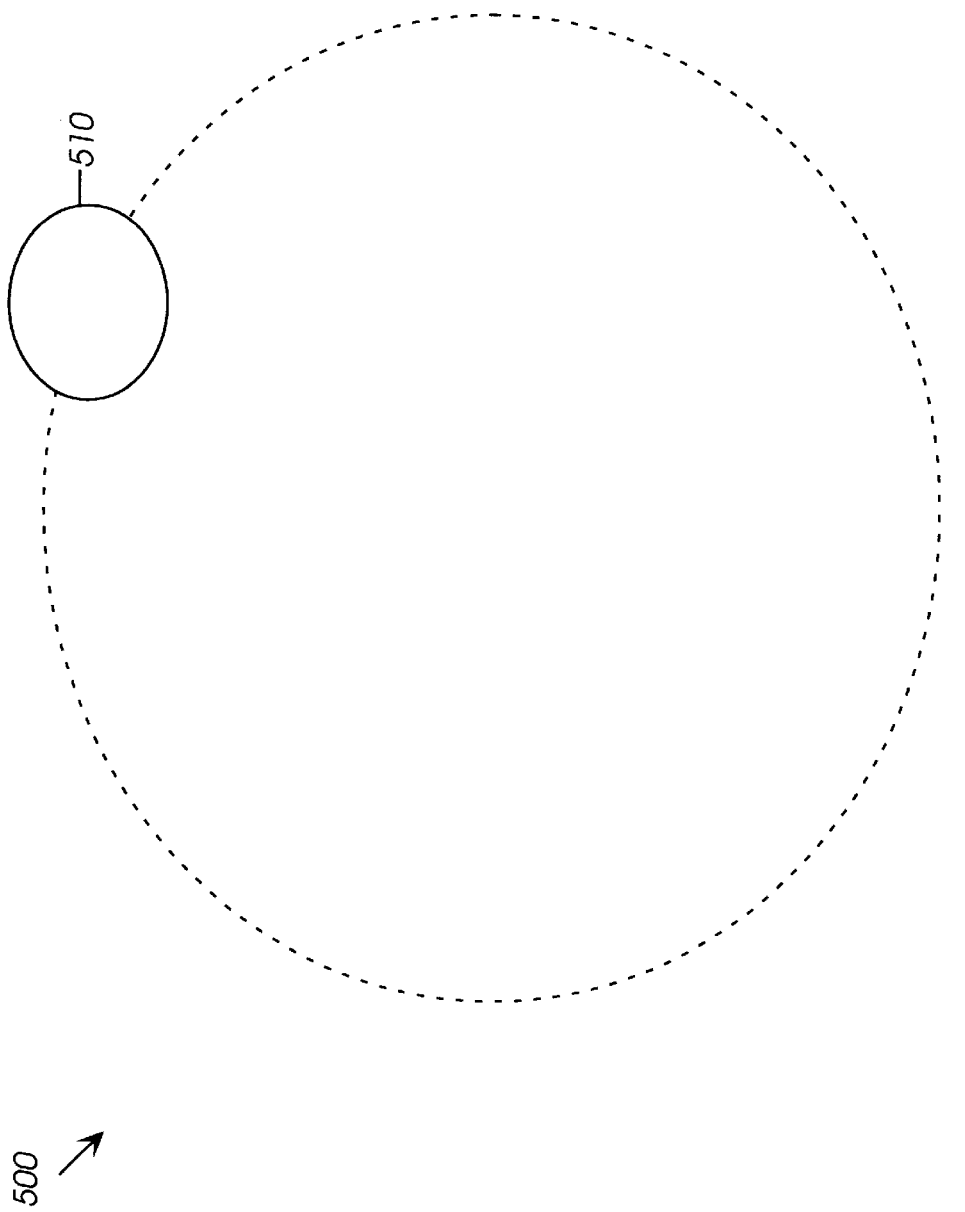
FIGS. 5a–5d are one embodiment of a state diagram of a state machine of an IC design generated from its high-level IC description language code.

FIGS. 5a–5d are one embodiment of a state diagram of a state machine of an IC design generated from its high-level IC description language code. More specifically, FIG. 5a is one embodiment of a generally circular layout of a state diagram according to the present invention. The dotted line describes the circular nature of state diagram 500 and is not necessarily included in state diagram 500.

State 510 is the starting state for state diagram 500. In one embodiment, state 510 is placed at the top of state diagram 500. Alternatively, state 510 can be placed in a location other than at the top of state diagram 500.

Figure 5B:
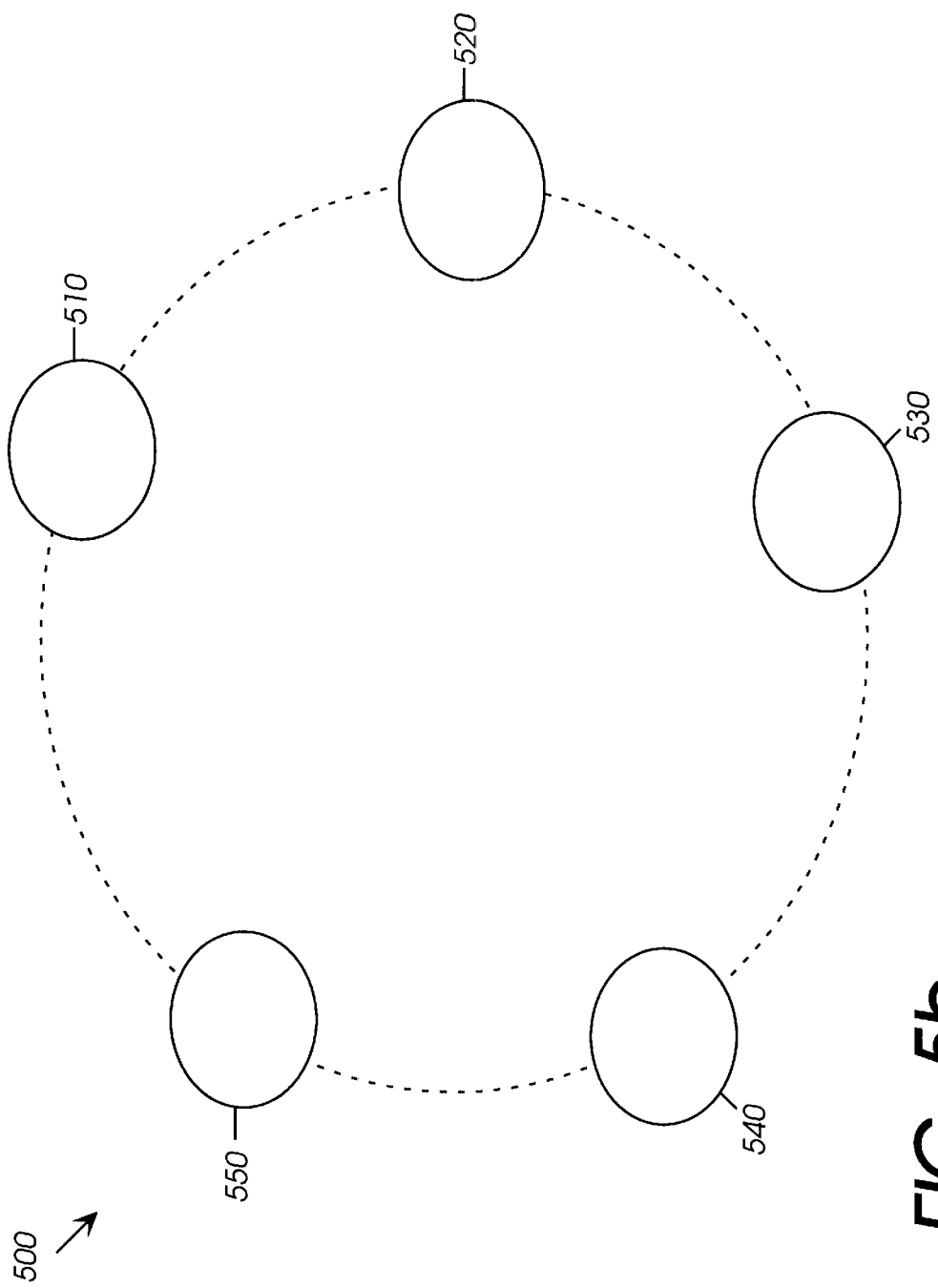

FIG. 5b is one embodiment of state diagram 500 having states placed in a generally circular manner. In one embodiment, states are placed such that transitions occur in a clockwise manner starting from start state 510 at the top of state diagram 500. For example, state 520 follows state 510 during normal operation of the corresponding state machine. States 530, 540 and 550 are placed in a similar manner. In one embodiment, the states of state diagram 500 are placed equidistant from each other; however, other placement schemes can also be used. It is important to note that the state diagram as generated by the present invention is not limited to any particular number of states.

Figure 5C:
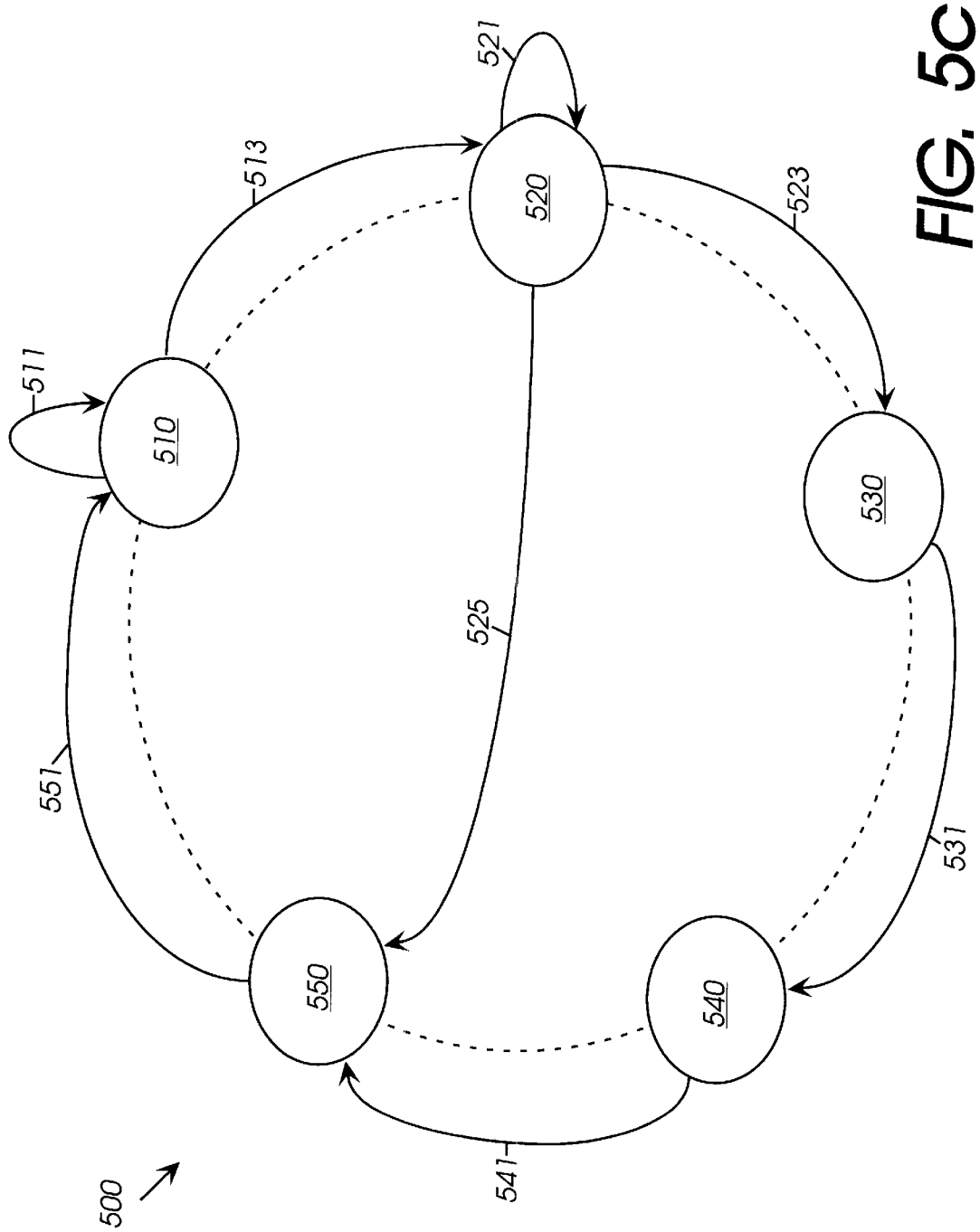

FIG. 5c is one embodiment of state diagram 500 having transition arcs routed between states. In one embodiment, transition arcs between adjacent states are routed outside of the state diagram circle. State transitions between non-adjacent states are routed inside of the state diagram circle. Of course, other routing schemes can also be used.

Arc 511 indicates a reset condition that causes the associated state machine to remain in state 510. Reset conditions are known in the art and not discussed in any greater detail except as it pertains the present invention. Reset conditions are optional and not required for all state machines. Arc 513 indicates a transition from state 510 to state 520 and is routed outside of the state circle.

Arc 521 indicates that a condition exists that causes the state machine to remain in state 520 during the existence of the condition. Arc 525 indicates a transition between state 520 and state 550. Because arc 525 indicates a transition between non-adjacent states, arc 525 is routed inside the state diagram circle. Arcs 523, 531, 541 and 551 indicate transitions between adjacent states and are routed outside of the state diagram circle.

Figure 5D:
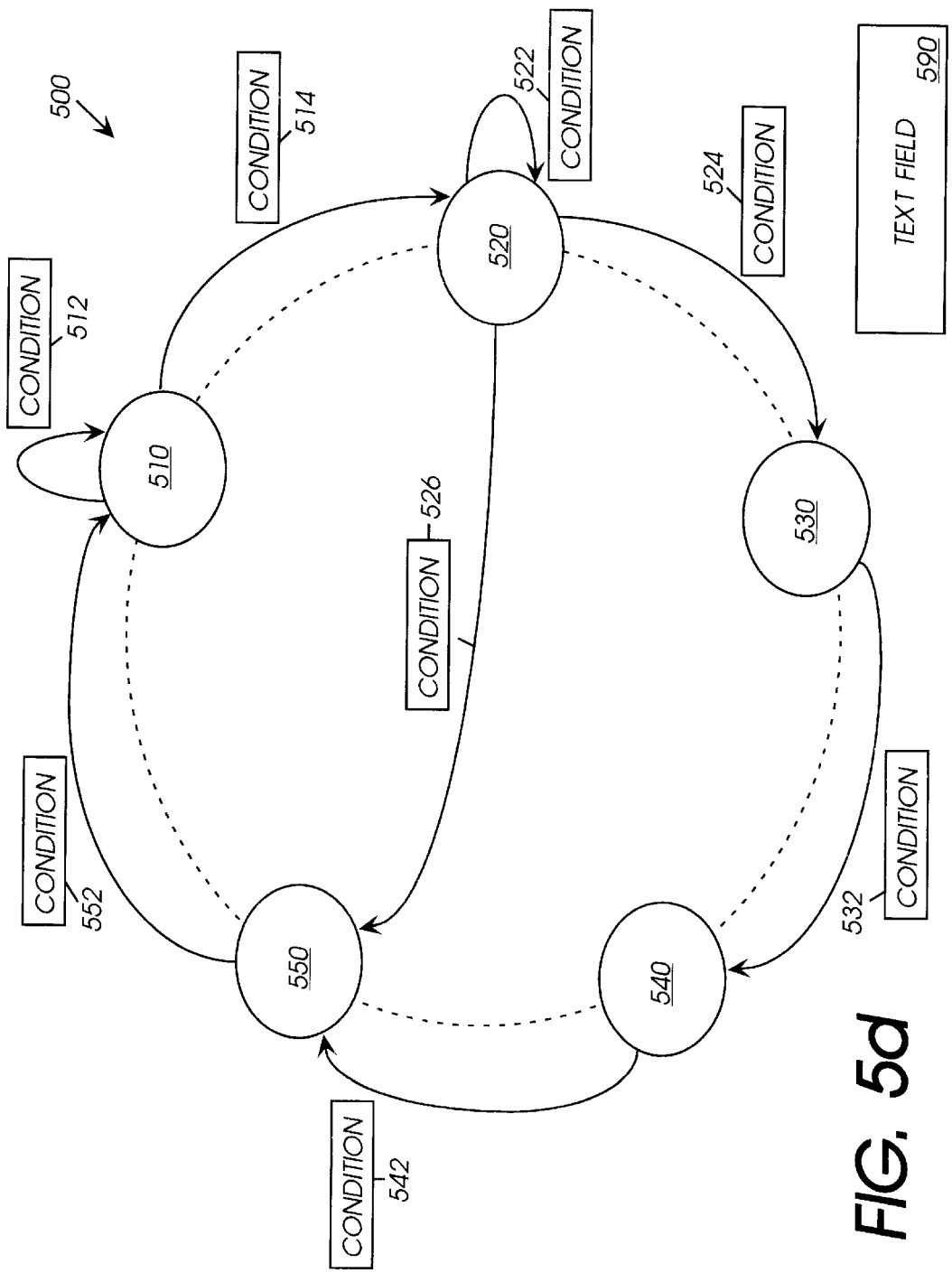

FIG. 5d is one embodiment of state diagram 500 with condition and other labels according to the present invention. State diagram 500 includes condition labels 512, 514, 522, 524, 526, 532, 542 and 552 that describe the conditions that cause the state transitions indicated by the respective associated arcs.

Text field 590 provides various textual descriptions associated with state diagram 500. For example, text field 590 can include package lists, global actions, concurrent statement, declarations and signal status statements.

Overview Of Flow Chart Extraction

Figure 6:
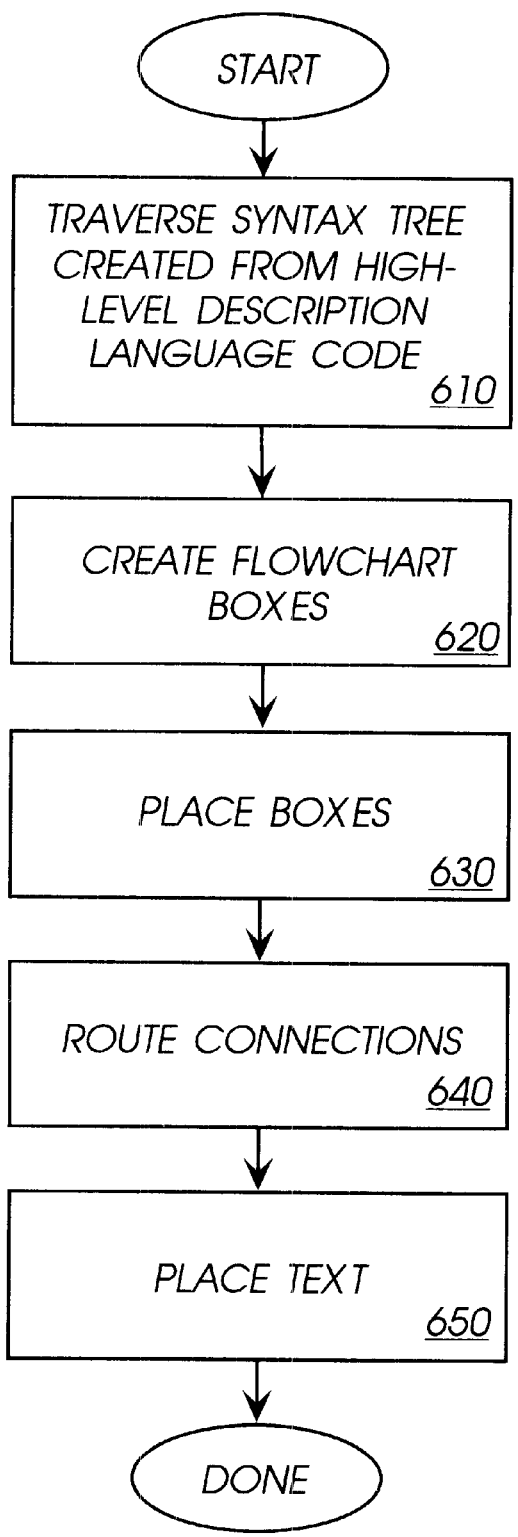
FIG. 6 is one embodiment of a flow diagram for providing a graphical representation of a flow chart of an operational flow of an IC design based on its high-level IC description language code.

FIG. 6 is one embodiment of a flow diagram for providing a graphical representation of a flow chart of an operational flow of an IC design based on its high-level IC description language code. In one embodiment, the present invention provides graphical description of the flow chart and describing high-level IC description language code. Typically, the high-level IC description language code is used to build an abstract syntax tree in a programming language such as C or C++.

The tree contains objects which represent VHDL Processes or Verilog Initial/Always statements. The syntax tree can be recursive in that objects can contain other objects. In one embodiment, the present invention uses Architecture and Module declarations and Concurrent statements and associated Process statements to generate the flow chart corresponding to the VHDL code.

Boxes are created that correspond to each high-level discussion language statement, 620. For example, action boxes, decision boxes, wait boxes can be used to represent high-level IC description language statements.

The boxes are then placed in a logical manner that represents the high-level IC description language code to a user, 630. In one embodiment of flow chart direction is top-down. Further, decision boxes are laid out so that the true branch starts at the bottom and the false branch is to the right of the score corresponding decision box. This is known as "top-down asymmetric" placement.

In one embodiment, placement starts with the start box. Each high-level IC description language code segment contains one start box. The start box is placed in the top of the flow diagram at a predetermined location. The next box in the flow chart is placed below the start box with the centers vertically aligned. Placement of boxes continues to similar manner.

Placement of boxes is asymmetric because action boxes decision boxes etc. are vertically aligned by their centers and true branches of decision boxes are similarly vertically aligned. False branches are placed to the right of the main flow. Before placing boxes the maximum width of each box is determined. Maximum width allows boxes to be placed without overlap, which can lead to a confusing flow chart. Maximum width is determined for each boxes in a branch prior to placement of the branch.

After the boxes have been placed, connections between the boxes are routed, 640. In one embodiment, connections consist of arrows showing the flow between boxes. Connections representing feedback loops are placed to the left of the boxes in the loop connecting the last box in the loop to the first box in loop. After notes have been placed and connections have been routed, any related text not included in boxes is placed on the flow chart, 650.

Figure 7A:
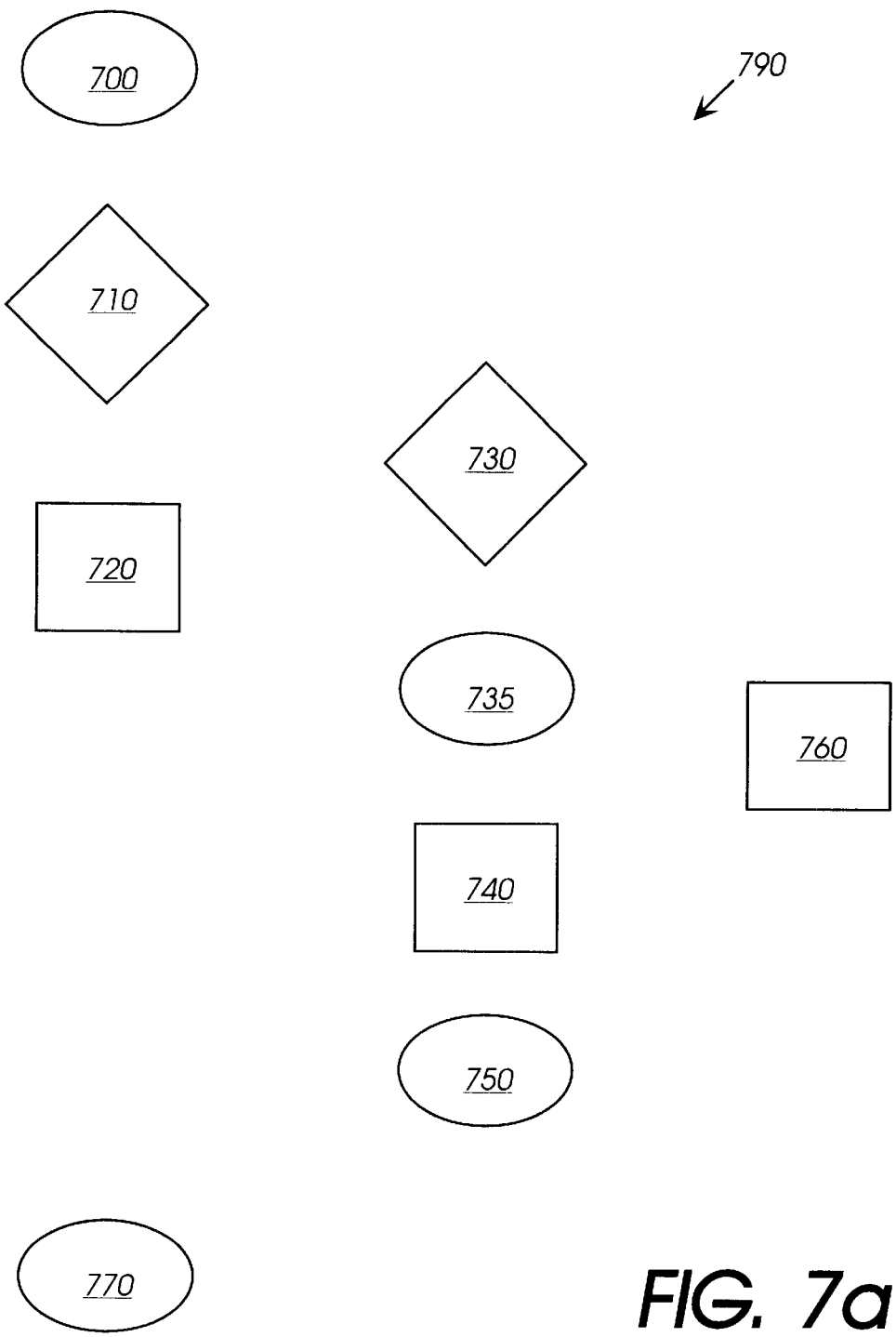
FIGS. 7a–7b are one embodiment of a flow chart of an operational flow of an IC design generated from its high-level IC description language code.
Figure 7B:
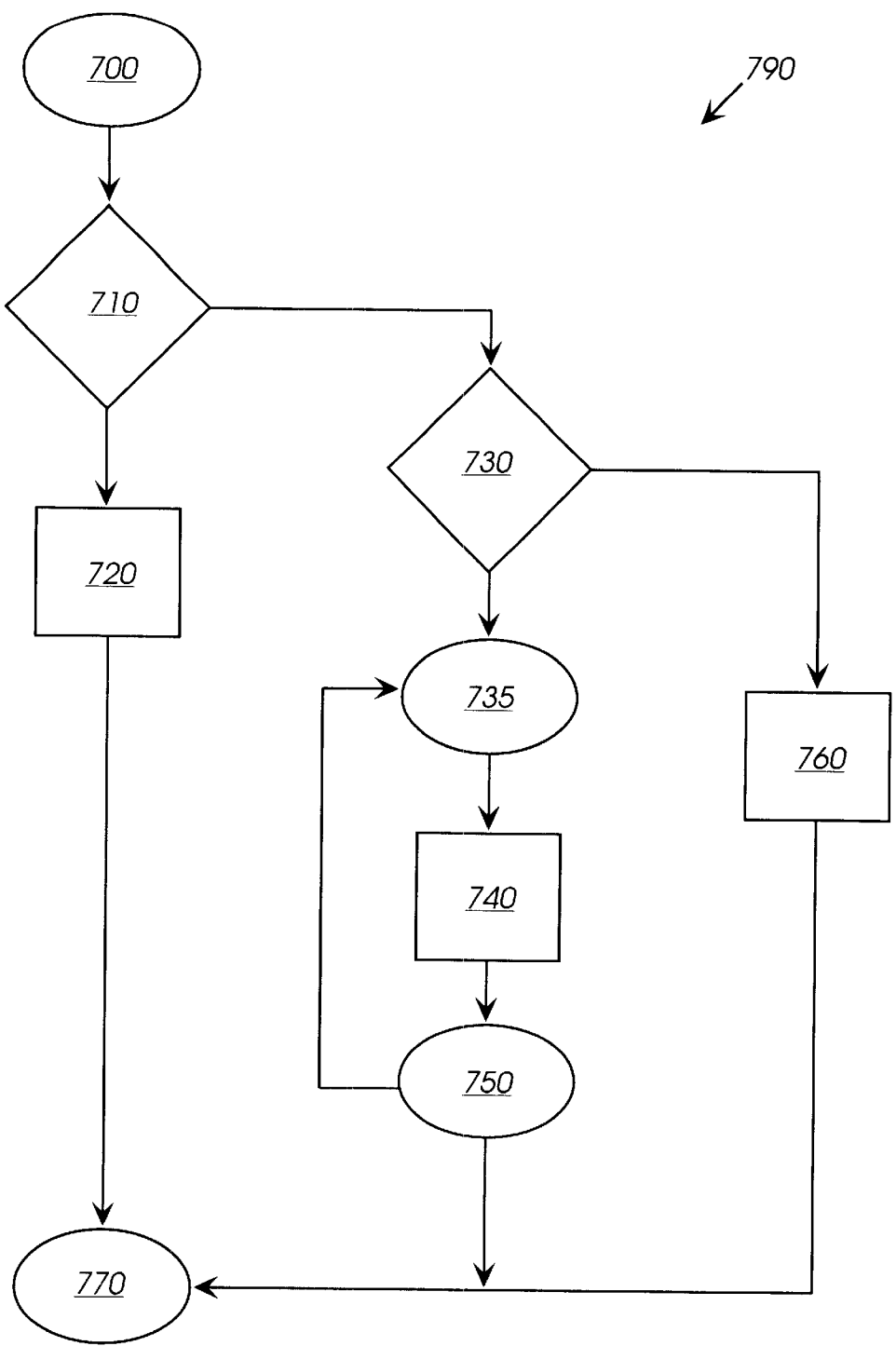

FIGS. 7a–7b are one embodiment of a flow chart of an operational flow of an IC design generated from its high-level IC description language code. In one embodiment, all flow chart boxes are generated prior to placement of the boxes. During the box generation process, boxes are placed in a common location so that the boxes visually appear to overlap until placed.

FIG. 7a is one embodiment of flow chart boxes placed according to the present invention. In one embodiment, boxes are placed starting with start box 700 at the top of the flow diagram. The next box in flow chart 790 is placed vertically below start box 700 with the centers of the two boxes vertically aligned. In the example of FIG. 7a, a decision box labeled 710 is placed below start box 700; however, any type of flow diagram box can be used to follow start box 700.

Because box 710 is a decision box, the flow of flow chart 790 branches at decision box 710. In one embodiment, true branches are placed vertically below the corresponding decision box and false branches are placed to the left of the corresponding decision box. In the example of FIG. 7a, box 720 is the true branch corresponding to decision box 710 and box 730 is the false branch corresponding to decision box 710. Boxes 735, 740, 750, 760 and 770 are placed in a similar manner.

In one embodiment, in order to provide placement of boxes such that boxes do not overlap, a maximum width is determined for each column of boxes. The width of each box is determined based on the text and other representations associated with the box. The width for the widest box in each column is the maximum width of the column. Columns of boxes are placed such that the maximum width of each column does not overlap the maximum width of an adjacent column.

FIG. 7b is one embodiment of flow chart 790 having flow connectors. The flow connectors indicate a flow through flow chart 790 in the manner described above. Flow indicators for loops are placed to the left of the boxes in the loop. For example, boxes 735, 740 and 750 comprises a loop in the example of FIG. 7b. Thus, the flow indicator from box 750 to box 735 is placed to the left of boxes 735, 740 and 750.

After boxes have been placed and flow indicators routed, textual descriptions (not shown in FIG. 7b) are placed in flow chart 790. For example, the actions of each box of flow chart 790 can be included within each box. Also, true and false indicators can be placed with each branch from a decision box. Other text, such as architecture declarations, concurrent statements, sensitivity lists and process declarations can be placed on flow chart 790 so as not to overlap the boxes of flow chart 790.

In the foregoing specification, the present invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A computer-implemented method comprising:

extracting, from high-level IC description language code, representation information corresponding to a) functional blocks of an IC design, b) a state machine, and c) an operation flow of the IC design; and generating a graphical representation of the IC design based on the extracted representation information, wherein the graphical representation comprises a block diagram for the functional blocks of the IC design, a state diagram for the state machine, and a flow chart for the operation flow of the IC design.

2. The method of claim 1, wherein extracting representation information corresponding to the functional blocks of the IC design comprises:

determining structural components of the IC design; and determining one or more connections between the structural components.

3. The method of claim 2, wherein generating the graphical representation of the IC design based on the extracted representation information corresponding to the functional blocks further comprises:

assigning each structural component to a block in a block diagram;

placing the each of the functional blocks based on the number of inputs to each block; and routing connections between the functional blocks.

4. The method of claim 3, wherein placing the blocks further comprises:

determining the number of inputs to each block;

placing the blocks in columns based on the number of inputs to each block; and placing the blocks horizontally such that multiple blocks do not overlap a horizontal channel.

5. The method of claim 4, wherein routing connections comprises routing connections between blocks such that the connections do not overlap for multiple consecutive points between blocks.

6. The method of claim 1, wherein extracting representation information corresponding to a state machine of the IC design further comprises:

determining a number of states supported by the state machine based on the high-level IC description language code; and determining conditions causing transitions between states.

7. The method of claim 6, wherein generating a graphical representation of the state machine of the IC further comprises:

displaying state representations in accordance with a predetermined orientation approach;

placing the state representations in accordance with a predetermined distance approach; and displaying transitions between adjacent states in accordance with a predetermined sequential approach.

8. The method of claim 7, wherein the predetermined orientation approach is generally circular.

9. The method of claim 8, further comprising:

displaying state transitions between adjacent states as arcs between the adjacent states outside the generally circular state diagram; and displaying state transitions between non-adjacent states as arcs between the non-adjacent states inside the generally circular state diagram.

10. The method of claim 1, wherein extracting from the high-level IC description language code representation information corresponding to an operation flow of the IC design comprises:

determining behavioral statements in the high-level IC description language; and determining one or more relationships between the behavioral statements.

11. The method of claim 10, wherein generating a graphical representation of the IC design based on the representation information corresponding to the flow chart further comprises:

placing boxes in accordance with a predetermined orientation approach;

placing the boxes based on a width corresponding to one or more of the boxes; and placing the boxes according to a predetermined flow approach.

12. An apparatus comprising:

means for extracting, from high-level IC description language code, representation information corresponding to a) functional blocks of an IC design, b) a state machine, and c) an operation flow of the IC design; and means for generating a graphical representation of the IC design based on the extracted representation information, wherein the graphical representation comprises a block diagram for the functional blocks of the IC design, a state diagram for the state machine, and a flow chart for the operation flow of the IC design.

13. The apparatus of claim 12, wherein the means for extracting representation information corresponding to functional blocks of the IC design comprises:

means for determining structural components of the IC design; and means for determining one or more connections between the structural components.

14. The apparatus of claim 13, wherein the means for generating a graphical representation of the IC design based on the extracted representation information corresponding to the functional blocks further comprises:

means for assigning each structural component to a block in a block diagram;

means for placing the blocks based on the number of inputs to each block; and means for routing connections between blocks.

15. The apparatus of claim 14, wherein the means for placing the blocks further comprises:

means for determining the number of inputs to each block;

means for placing the blocks in columns based on the number of inputs to each block; and means for placing the blocks horizontally such that multiple blocks do not overlap a horizontal channel.

16. The apparatus of claim 15, wherein the means for routing connections comprises means for routing connections between blocks such that the connections do not overlap for multiple consecutive points between blocks.

17. The apparatus of claim 12, wherein the means for extracting representation information corresponding to a state machine of the IC design further comprises:

means for determining a number of states supported by the state machine based on the high-level IC description language code; and means for determining conditions causing transitions between states.

18. The apparatus of claim 17, wherein the means for generating a graphical representation of the IC design corresponding to the extracted representation information of a state machine of the IC further comprises:

means for displaying state representations in accordance with a predetermined orientation approach;

means for placing the state representations in accordance with a predetermined distance approach; and means for displaying transitions between adjacent states in accordance with a predetermined sequential approach.

19. The apparatus of claim 18, wherein the predetermined orientation approach is generally circular.

20. The apparatus of claim 19, further comprising:

means for displaying state transitions between adjacent states as arcs between the adjacent states outside the generally circular state diagram; and means for displaying state transitions between non-adjacent states as arcs between the non-adjacent states inside the generally circular state diagram.

21. The apparatus of claim 12, wherein the means for extracting from the high-level IC description language code representation information corresponding to an operation flow of the IC design comprises:

means for determining behavioral statements in the high-level IC description language; and means for determining one or more relationships between the behavioral statements.

22. The apparatus of claim 21, wherein the means for generating a graphical representation of the IC design based on the representation information corresponding to the operational flow further comprises:

means for placing boxes in accordance with a predetermined orientation approach;

means for placing the boxes based on a width corresponding to one or more of the boxes; and means for placing the boxes according to a predetermined flow approach.

23. A machine-readable medium having stored thereon sequences of instructions, which when executed cause a processor to:

extract, from high-level IC description language code, representation information corresponding to a) functional blocks of an IC design, b) a state machine, and c) an operation flow of the IC design; and generate a graphical representation of the IC design based on the extracted representation information, wherein the graphical representation comprises a block diagram for the functional blocks of the IC design, a state diagram for the state machine, and a flow chart for the operation flow of the IC design.

24. The machine-readable medium of claim 23, wherein the sequences of instructions that cause the processor to extract representation information corresponding to functional blocks of the IC design comprises sequences of instructions that, when executed, cause the processor to:

determine structural components of the IC design; and determine one or more connections between the structural components.

25. The machine-readable medium of claim 24, wherein the sequences of instructions that cause the processor to generate a graphical representation of the IC design based on the extracted representation information corresponding to the functional blocks further comprise sequences of instructions that, when executed, cause the processor to:

assign each structural component to a block in the block diagram;

place the blocks based on the number of inputs to each block; and route connections between blocks.

26. The machine-readable medium of claim 25, wherein the sequences of instructions that cause the processor to place the blocks further comprise sequences of instructions that, when executed, cause the processor to:

determine the number of inputs to each block;

place the blocks in columns based on the number of inputs to each block; and place the blocks horizontally such that multiple blocks do not overlap a horizontal channel.

27. The machine-readable medium of claim 26, wherein the sequences of instructions that cause the processor to route connections comprises sequences of instructions that, when executed, cause the processor to route connections between blocks such that the connections do not overlap for multiple consecutive points between blocks.

28. The machine-readable medium of claim 23, wherein the sequences of instructions that cause the processor to extract representation information corresponding to a state machine of the IC design further comprise sequences of instructions that, when executed, cause the processor to:

determine a number of states supported by the state machine based on the high-level IC description language code; and determine conditions causing transitions between states.

29. The machine-readable medium of claim 28, wherein the sequences of instructions that cause the processor to generate a graphical representation of the IC design corresponding to the extracted representation information of a state machine of the IC further comprise sequences of instructions that, when executed, cause the processor to:

display state representations in accordance with a predetermined orientation approach;

place the state representations in accordance with a predetermined distance approach; and display transitions between adjacent states in accordance with a predetermined sequential approach.

30. The machine-readable medium of claim 29, wherein the predetermined orientation approach is generally circular.

31. The machine-readable medium of claim 30, further comprising sequences of instructions that, when executed, cause the processor to:

display state transitions between adjacent states as arcs between the adjacent states outside the generally circular state diagram; and display state transitions between non-adjacent states as arcs between the non-adjacent states inside the generally circular state diagram.

32. The machine-readable medium of claim 23, wherein the sequences of instructions that cause the processor to extract from the high-level IC description language code representation information corresponding to an operation flow of the IC design comprises sequences of instructions that, when executed, cause the processor to:

determine behavioral statements in the high-level IC description language; and determine one or more relationships between the behavioral statements.

33. The machine-readable medium of claim 32, wherein the sequences of instructions that cause the processor to generate a graphical representation of the IC design based on the representation information corresponding to the operational flow further comprise sequences of instructions that, when executed, cause the processor to:

place boxes in accordance with a predetermined orientation approach;

place the boxes based on a width corresponding to one or more of the boxes; and place the boxes according to a predetermined flow approach.

* * * * *